United States Patent
Jeng et al.

(10) Patent No.: US 8,420,745 B2
(45) Date of Patent: Apr. 16, 2013

(54) THERMALLY CURABLE SOLDER RESIST COMPOSITION

(75) Inventors: Jhy-Long Jeng, Junghe (TW); Jeng-Yu Tsai, Chiayi (TW); Shur-Fen Liu, Baoshan Township (TW); Jinn-Shing King, Hsinchu (TW)

(73) Assignee: Industrial Technology Research Institute (TW)

( * ) Notice: Subject to any disclaimer, the term of this patent is extended or adjusted under 35 U.S.C. 154(b) by 64 days.

(21) Appl. No.: 13/216,653

(22) Filed: Aug. 24, 2011

(65) Prior Publication Data

US 2011/0306703 A1 Dec. 15, 2011

Related U.S. Application Data

(63) Continuation-in-part of application No. 12/437,217, filed on May 7, 2009, now abandoned.

(30) Foreign Application Priority Data

Dec. 30, 2008 (TW) ............................... 97151360 A

(51) Int. Cl.
  C08G 59/14 (2006.01)
  C08G 59/40 (2006.01)
  C08G 59/22 (2006.01)
  C08L 63/00 (2006.01)
  H05K 3/28 (2006.01)

(52) U.S. Cl.
  USPC ............... 525/438; 528/295.3; 528/295.6; 528/297; 528/332; 528/359

(58) Field of Classification Search .................. None
  See application file for complete search history.

(56) References Cited

U.S. PATENT DOCUMENTS

| 3,979,477 A | 9/1976 | Schmid et al. |
| 4,069,203 A | 1/1978 | Carey et al. |
| 4,582,895 A | 4/1986 | Peerman et al. |
| 4,952,645 A | 8/1990 | Mulhaupt et al. |
| 5,637,356 A | 6/1997 | Kerr et al. |
| 6,818,702 B1 | 11/2004 | Orikabe et al. |
| 2006/0106144 A1* | 5/2006 | Appelman et al. ............ 524/300 |
| 2007/0088134 A1 | 4/2007 | Suzuki et al. |
| 2007/0293636 A1 | 12/2007 | Kimura et al. |
| 2007/0299218 A1* | 12/2007 | Yeh et al. ...................... 525/524 |
| 2008/0139728 A1* | 6/2008 | Klopsch et al. ............... 524/442 |

FOREIGN PATENT DOCUMENTS

| GB | 1183434 | 3/1970 |
| JP | 4-366124 | 12/1992 |
| JP | 05-039440 | 2/1993 |
| JP | 2006-124681 | 5/2006 |
| JP | 2007-246648 | 9/2007 |
| JP | 2008-272835 | 11/2008 |
| TW | 200634041 | 10/2006 |
| TW | 200801109 | 1/2008 |
| WO | WO 2007/018074 | 2/2007 |

OTHER PUBLICATIONS

OA dated Jun. 15, 2012 from corresponding application No. TW 97151360.

* cited by examiner

*Primary Examiner* — Cynthia Hamilton
(74) *Attorney, Agent, or Firm* — Lowe Hauptman Ham & Berner, LLP

(57) ABSTRACT

A thermally curable solder resist composition for a flexible printed circuit board is provided. The solder resist composition includes (a) 50-100 parts by weight of an epoxy resin, wherein the epoxy resin includes at least an aliphatic polyester modified epoxy resin having formula (I) or (II), in which, each of $R_1$ and $R_2$, independently, is a $C_{6-38}$ saturated or an unsaturated carbon chain, $R_3$ is ether, phenyl, a $C_{6-38}$ heterocyclic or $C_{6-38}$ saturated carbon chain, n is an integer of 1-10 and the aliphatic polyester modified epoxy resin had a molecular weight of 1000-5000; (b) 1-10 parts by weight of a curing agent; and (c) 1-10 parts by weight of a catalyst.

13 Claims, No Drawings

THERMALLY CURABLE SOLDER RESIST COMPOSITION

CROSS REFERENCE TO RELATED APPLICATIONS

This application is a Continuation-In-Part of U.S. patent application Ser. No. 12/437,217, filed May 7, 2009, now abandoned, and entitled "THERMALLY CURABLE SOLDER RESIST COMPOSITION", which claims priority of Taiwan Patent Application No. 97151360, filed on Dec. 30, 2008, the entirety of which is incorporated by reference herein.

BACKGROUND

1. Technical Field

The disclosure relates to thermally curable solder resist composition.

2. Description of the Related Art

Flexible printed circuit boards are flexible, and satisfy requirements of being light weight, thin, and small for electronic products and are widely applied to various industries such as the aircraft industry, the mechanical industry, the automobile industry and the electronics industry. Because copper wires on the flexible printed circuit boards are easily oxidized by environmental influences, a protective film with functions similar to a solder mask is required covering the copper wires to prevent oxidization of the copper wires. A solder mask is an ink consisting of epoxy resin, which is brittle and not flexible enough for flexible printed circuit boards after being formed as a film on flexible printed circuit boards. Thus, solder masks are not suitable for use in flexible printed circuit boards.

The conventional material of protective films used in flexible printed circuit boards is a polyimide (PI) or an acrylic protective film containing one layer of epoxy resin adhesive. While the above mentioned materials can be applied to copper clad laminates with no adhesives, the structure of the materials thereof would be asymmetric and thus flexibility of flexible printed circuit board using the above mentioned materials would be insufficient. Additionally, heat resistance of epoxy resin adhesive layers is poor and shrinkage thereof is large, thus negatively effecting heat resistance and dimensional stability of flexible printed circuit boards made of the above mentioned materials. Moreover, the above mentioned materials are applied to chip on flex (COF) products, wherein flexible printed circuit boards made thereof are required to be good bending resistance. However, because conventional PI protective films containing epoxy resin adhesive layers are too rigid, fixing problems occur when bending the flexible printed circuit boards made of the above mentioned materials. Thus, conventional material of protective films used in flexible printed circuit boards can not be used in chip on flex (COF) products.

A liquid protective film material used in flexible printed circuit boards is made by an epoxy resin system, which requires adding rubber as a soft agent to improve flexibility thereof. However, heat resistance of rubber is poor and compatibility of rubber with epoxy resin is insufficient. If too much rubber is added, heat resistance of the protective film would be poor and problems would occur during fabrication soldering processes at high temperatures. However, if too little rubber is added, the flexibility of the protective film would be poor and the protective film would easily crack.

U.S. Pat. No. 6,818,702 and US Publication No. 2007/0088134 disclose a modified epoxy resin with flexibility characteristics. Polybutadiene with end groups containing —COOH or an —OH functional group is used to react with epoxy resin. Although the flexibility of the above mentioned materials is improved, the synthesis steps of the above mentioned materials are complex and heat resistance and the adhesion thereof are poor. Thus, the modified epoxy resin with flexibility characteristics easily delaminated from substrates during subsequent processes.

Meanwhile, Japan Patent No. JP2006124681 and JP2007246648 and US Publication No. 2007/0293636 disclose utilizing urethane to modify epoxy resin. Polycarbonate and diisocyanate having —OH functional groups are reacted with dimethylopropionic acid to form urethane having a —COOH functional group, and then the urethane is mixed with epoxy resin. Although the above mentioned materials have good flexibility, the ratio of urethane is too high, such that heat resistance and the chemical resistance thereof are poor. While an acrylic rubber may be utilized to be added to the epoxy resin to improve flexibility, the heat resistance of acrylic rubber is lower than epoxy resin, thus negatively effecting heat resistance thereof.

Therefore, a solder resist composition with sufficient flexibility, sufficient heat resistance and other properties to satisfy requirements of protective films of flexible printed circuit boards is desired.

SUMMARY

The invention provides a thermally curable solder resist composition for a flexible printed circuit board. The thermally curable solder resist composition includes (a) 50-100 parts by weight of an epoxy resin, wherein the epoxy resin includes at least an aliphatic polyester modified epoxy resin having Formula (I) or (II):

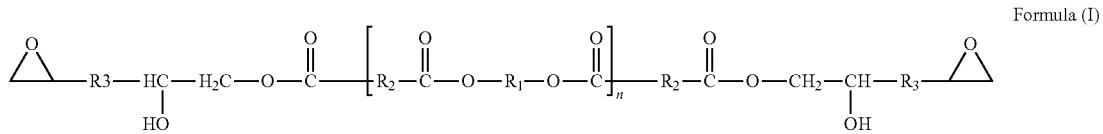

Formula (I)

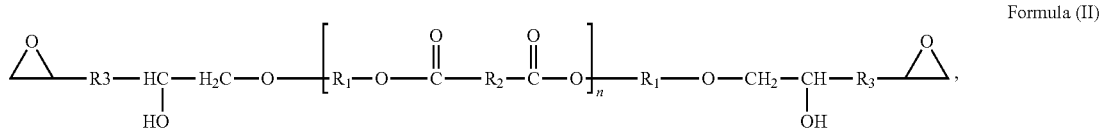

Formula (II)

wherein each of $R_1$ and $R_2$, independently, is a $C_{6-38}$ saturated or an unsaturated carbon chain, $R_3$ is ether, phenyl, a $C_{6-38}$ heterocyclic or $C_{6-38}$ saturated carbon chain, n is an integer of 1-10 and the aliphatic polyester modified epoxy resin had a molecular weight of 1000-5000; (b) 1-10 parts by weight of a curing agent; and (c) 1-10 parts by weight of a catalyst.

DETAILED DESCRIPTION

The following description is of the best-contemplated mode of carrying out the invention. The description is provided for illustrating the general principles of the invention and is not meant to be limiting. The scope of the invention is best determined by reference to the appended claims.

The thermally curable solder resist compositions of the invention are mainly used for the protective films of flexible printed circuit boards (FPC) to protect copper wires on the FPC. Moreover, the thermally curable solder resist compositions can resist a solder process, thus the thermally curable solder resist composition can be used as a solder mask to prevent copper wires from being damaged due to fabrication processes.

The thermally curable solder resist compositions of the invention include at least an aliphatic polyester modified epoxy resin. The aliphatic polyester is soft and has low water absorption. Moreover, the aliphatic polyester can absorb shock and stress, and had a hydrophobic property. Thus, by utilizing the aliphatic polyester to modify epoxy resin, soft segment structures of polyester with high molecular weight and large size can be added into the epoxy resin to enhance flexibility and reduce water permeability of the epoxy resin materials. In addition, aliphatic polyester does not easily decompose when heated or oxidized. Thus, the thermally curable solder resist compositions of the invention have excellent flexibility, low water absorption and thermal stability to satisfy the requirements for protective films of flexible printed circuit boards, and can be used as solder inks of flexible printed circuit boards.

In an embodiment of the invention, the thermally curable solder resist composition comprises: (a) 50-100 parts by weight of epoxy resin, comprising at least an aliphatic polyester modified epoxy resin represented by Formula (I) or (II):

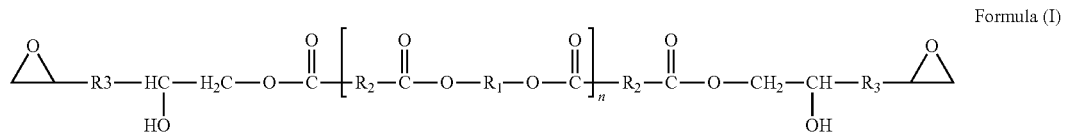

Formula (I)

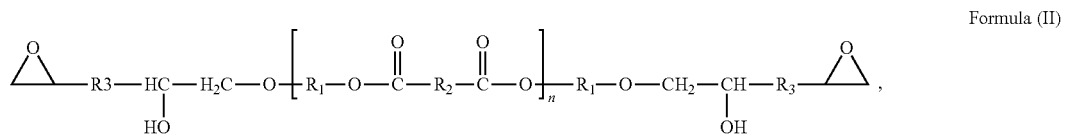

Formula (II)

wherein each of $R_1$ and $R_2$, independently, is a $C_{6-38}$ saturated or an unsaturated carbon chain, $R_3$ is ether, phenyl, a $C_{6-38}$ heterocyclic or $C_{6-38}$ saturated carbon chain, n is an integer of 1-10 and the aliphatic polyester modified epoxy resin had a molecular weight of 1000-5000; (b) 1-10 parts by weight of a curing agent; and (c) 1-10 parts by weight of a catalyst.

In the above mentioned epoxy resin, the aliphatic polyester modified epoxy resin is about 30-100 weight % or 50-80 weight % based on the total epoxy resin. The other epoxy resin may be bisphenol-A epoxy resin, cycloaliphatic epoxy resin, phenyl containing epoxy resin, bisphenyl containing epoxy resin, phenolic epoxy resin, carboxyl-terminated acrylonitrile-butadiene (CTBN) modified epoxy resin or combinations thereof except for the aliphatic polyester modified epoxy resin.

The above mentioned curing agent may be an anhydride derivative, a diamine derivative, or polyamine. The anhydride derivative, for example, is methyl hexahydrophthalic anhydride (MHHPA) or methyltetrahydrophthalic anhydride. The diamine derivative, for example, is 4,4-diaminodiphenyl sulfone. The polyamine, for example, is polyether diamine.

The above mentioned catalyst may be an imidazole derivative, for example, 2-ethyl-4-methyl-imidazole, 2,4-diamino-6-[2-(2-methyl-1-imidazolyl)ethyl]1,3,5-triazine, or 2-methylimidazole.

In addition, the other additives, for example, a leveling agent, an inorganic filler, a pigment, a deformer, a flame retardant or combinations thereof can be added into the thermally curable solder resist compositions of the invention to enhance processing ability and physical property of the solder mask materials. The total amount of the additives may be 1-10 parts by weight in the thermally curable solder resist compositions.

The reactions for preparing the aliphatic polyester modified epoxy resins represented by Formula (I) and Formula (II) are shown as below:

Reaction (1)

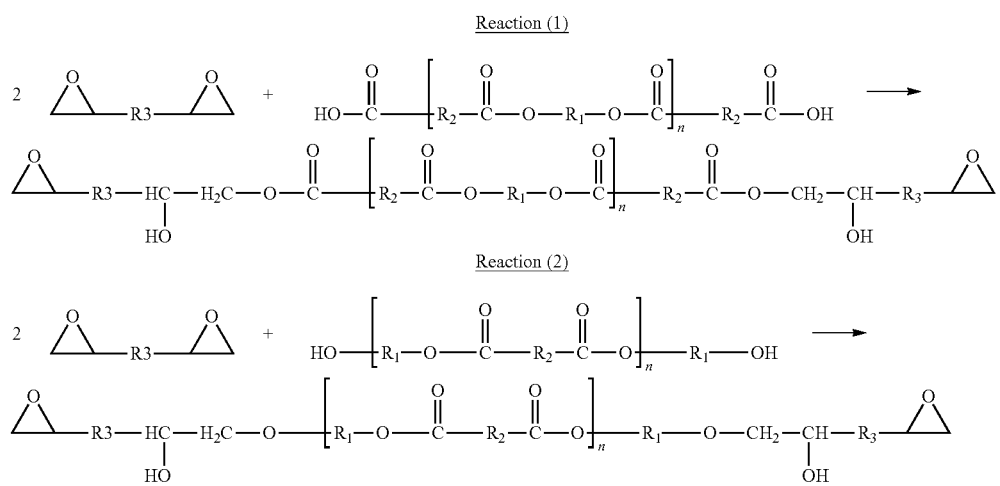

Reaction (2)

The aliphatic polyester modified epoxy resin represented by Formula (I) is formed by the reaction (1) of an epoxy resin with an aliphatic polyester diacid compound. The aliphatic polyester modified epoxy resin represented by Formula (II) is formed by the reaction (2) of an epoxy resin with an aliphatic polyester diol compound. In the reactions (1) and (2), each of $R_1$ and $R_2$, independently, is a $C_{6-38}$ saturated or an unsaturated carbon chain, $R_3$ is ether, phenyl, a $C_{6-38}$ heterocyclic or $C_{6-38}$ saturated carbon chain, and n is an integer of 1-10.

The thermally curable solder resist compositions of the invention can be coated on the flexible printed circuit boards by a screen printing method, and then cured at a temperature between 150-180° C. Moreover, the thermally curable solder resist compositions of the invention can be used as a solder protective film or an adhesive for rigid printed circuit boards.

The fabrication methods and the properties of the thermally curable solder resist compositions for the Examples and the Comparative Examples are described in detail as below:

Preparation Example 1 for Epoxy Resin E-1

50 grams of an aliphatic polyester diacid compound (a weight average molecular weight (Mw) of 1500, product of CRODA Company) and 50 grams of epoxy resin (product model of Epikot 828, product of Shell Company) were dissolved in 111 grams of gamma-butyrolactone (GBL) by using a mechanical stirrer and a triple-necked spherical-bottom bottle with a nitrogen gas input. After uniform mixing, the mixture was heated to 110° C. for reaction for 3 hours to obtain an aliphatic polyester modified epoxy resin E-1. The aliphatic polyester modified epoxy resin E-1 had a weight average molecular weight of about 2250, and the structure thereof is shown as below:

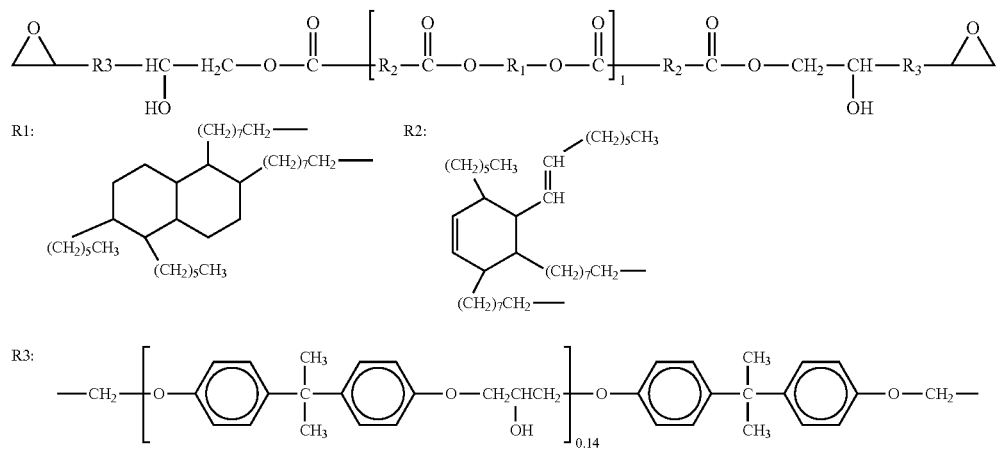

Preparation Example 2 for Epoxy Resin E-2

50 grams of an aliphatic polyester diacid compound (a weight average molecular weight (Mw) of 3000, product of CRODA Company) and 100 grams of epoxy resin (product model of Epikot 828, product of Shell Company) were dissolved in 50 grams of gamma-butyrolactone (GBL) by using a mechanical stirrer and a triple-necked spherical-bottom bottle with a nitrogen gas input. After uniform mixing, the mixture was heated to 110° C. for reaction for 3 hours to obtain an aliphatic polyester modified epoxy resin E-2. The aliphatic polyester modified epoxy resin E-2 had a weight average molecular weight of about 3750, and the structure thereof is shown as below:

of gamma-butyrolactone (GBL). After uniform mixing, the mixture of Vanish V-1 was formed.

Then, 5 grams of a curing agent of methyl hexahydrophthalic anhydride (MHHPA), 2 grams of a catalyst of 2,4-diamino-6-[2-(2-methyl-1-imidazolyl)ethyl]1,3,5-triazine

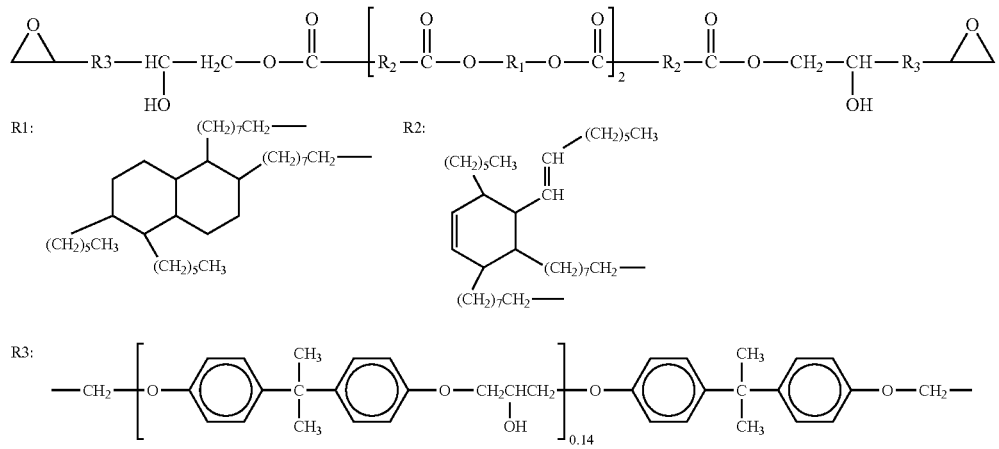

Preparation Example 3 for Epoxy Resin E-3

50 grams of an aliphatic polyester diol compound (a weight average molecular weight (Mw) of 1500, product of CRODA Company) and 50 grams of epoxy resin (product model of Epikot 828, product of Shell Company) were dissolved in 111 grams of gamma-butyrolactone (GBL) by using a mechanical stirrer and a triple-necked spherical-bottom bottle with a nitrogen gas input. After uniform mixing, the mixture was heated to 110° C. for reaction for 3 hours to obtain an aliphatic polyester modified epoxy resin E-3. The aliphatic polyester modified epoxy resin E-3 had a weight average molecular weight of about 2250, and the structure thereof is shown as below:

(2MAZ-PW) (product of Shikoku International Corporation), 2 grams of a pigment green, 5 grams of a silica filler (product model of Aerosil-380, product of Degussa Company) and 1 gram of a deformer (product model of KS-66, product of Shin-Etsu Company) were mixed with the mixture of Vanish V-1 and ground uniformly by a triple-roll mill to form the thermally curable solder resist resin material of Example 1.

Example 2

The fabrication method of Example 2 was the same as that of Example 1, except that the amount of the aliphatic polyester modified epoxy resin E-1 added was 70 grams, the amount

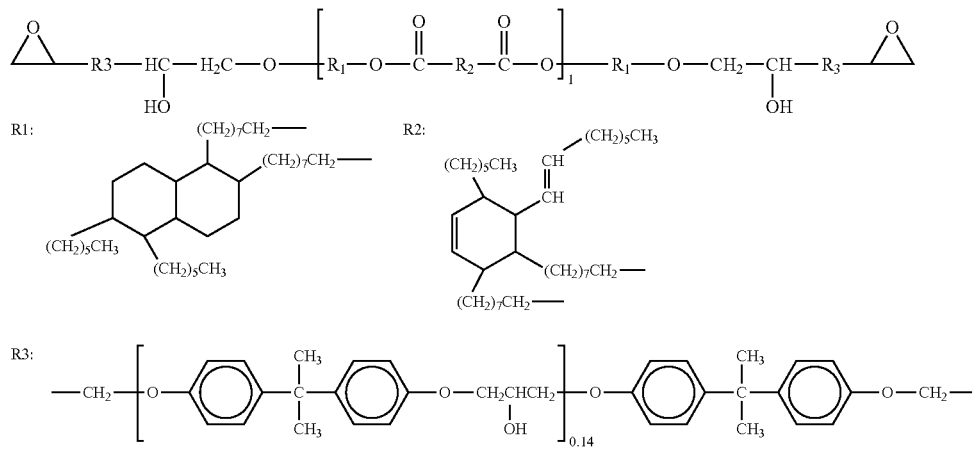

Example 1

50 grams of the aliphatic polyester modified epoxy resin E-1 and 50 grams of epoxy resin (product model of Epikot 828, product of Shell Company) were dissolved in 22 grams of epoxy resin Epikot 828 added was 30 grams, the amount of the curing agent MHHPA added was 5 grams, and the amount of a catalyst added of 2-ethyl-4-methyl-imidazole (2E4MI) (product of Shikoku International Corporation) was 2 grams. Then, the thermally curable solder resist resin material of Example 2 was obtained.

Example 3

70 grams of the aliphatic polyester modified epoxy resin E-2 and 30 grams of epoxy resin Epikot 828 were dissolved in 22 grams of gamma-butyrolactone (GBL). After uniform mixing, the mixture of Vanish V-2 was formed.

Then, 5 grams of the curing agent of methyl hexahydrophthalic anhydride (MHHPA), 2 grams of the catalyst of 2,4-diamino-6-[2-(2-methyl-1-imidazolyl)ethyl]1,3,5-triazine (2MAZ-PW), 2 grams of a pigment green, 5 grams of the silica filler Aerosil-380, and 1 gram of the deformer KS-66 were mixed with the mixture of Vanish V-2 and ground uniformly by a triple-roll mill to form the thermally curable solder resist resin material of Example 3.

Example 4

The fabrication method of Example 4 was the same as that of Example 3. 80 grams of the aliphatic polyester modified epoxy resin E-2 and 20 grams of a CTBN modified epoxy resin (product model of EPOMIK SR3542, product of Mitsui Chemical Company) were dissolved in 35 grams of gamma-butyrolactone (GBL). After uniform mixing, the mixture of Vanish V-4 was formed.

Then, 5 grams of the curing agent MHHPA, 2 grams of the catalyst of 2-ethyl-4-methyl-imidazole (2E4MI), 2 grams of a pigment green, 5 grams of the silica filler Aerosil-380, and 1 gram of the deformer KS-66 were mixed with the mixture of Vanish V-4 and ground uniformly by a triple-roll mill to form the thermally curable solder resist resin material of Example 4.

Example 5

70 grams of the aliphatic polyester modified epoxy resin E-3 and 30 grams of epoxy resin Epikot 828 were dissolved in 30 grams of gamma-butyrolactone (GBL). After uniform mixing, the mixture of Vanish V-5 was formed.

Then, 5 grams of the curing agent of MHHPA, 2 grams of the catalyst of 2E4MI, 2 grams of a pigment green, 5 grams of the silica filler Aerosil-380, and 1 gram of the deformer KS-66 were mixed with the mixture of Vanish V-5 and ground uniformly by a triple-roll mill to form the thermally curable solder resist resin material of Example 5.

Comparative Example 1

70 grams of epoxy resin (product model of Epikot 828, product of Shell Company), 30 grams of epoxy resin (product model of Epon 1001, product of Shell Company), 20 grams of a curing agent of diaminodiphenyl sulphone (DDS) and a catalyst of $BF_3$ were dissolved in 75 grams of gamma-butyrolactone (GBL) to form a mixture. Then, 2 grams of a pigment green, 5 grams of the silica filler Aerosil-380, and 1 gram of the deformer KS-66 were mixed with the above mixture and ground uniformly by a triple-roll mill to form the thermally curable solder resist resin material of Comparative Example 1.

Comparative Example 2

The fabrication method of Comparative Example 2 was the same as that of Example 1. 20 grams of the aliphatic polyester modified epoxy resin E-1, 80 grams of epoxy resin Epikot 828, 20 grams of the curing agent of diaminodiphenyl sulphone (DDS) and the catalyst of $BF_3$ were dissolved in 75 grams of gamma-butyrolactone (GBL) to form a mixture. Then, 2 grams of a pigment green, 5 grams of the silica filler Aerosil-380, and 1 gram of the deformer KS-66 were mixed with the above mixture and ground uniformly by a triple-roll mill to form the thermally curable solder resist resin material of Comparative Example 2.

The above mentioned resin materials of Examples 1-5 were coated on substrates of flexible printed circuit boards, respectively. After curing at 150° C. for 60 minutes, a film was formed on the substrate of the flexible printed circuit board. Then, the films of the materials of Examples 1-5 were tested by a flexibility test. In addition, the resin materials of Comparative Examples 1-2 were also coated on the substrates of the flexible printed circuit boards respectively and then cured at 180° C. for 120 minutes to form a film. Then, the films of Comparative Examples 1-2 were tested by the flexibility test. The flexibility test was performed by repeatedly bending a test sample at an angle of 180 degrees to obtain the number of times of bending. In the flexibility test, the coating of resin material on the test sample was on the outside while bending. The results of the flexibility test for the Examples 1-5 and the Comparative Examples 1-2 are shown in Table 1. As shown in Table 1, the solder resists of the Examples of the invention were not damaged by bending above 20 times. However, the solder resists of the Comparative Examples were damaged by bending only 1-4 times.

TABLE 1

The resin material compositions and the flexibility of the Examples and the Comparative Examples

| Composition | Example 1 | Example 2 | Example 3 | Example 4 | Example 5 | Comparative Example 1 | Comparative Example 2 |
|---|---|---|---|---|---|---|---|
| E-1 (g) | 50 | 70 | — | — | — | — | 20 |
| E-2 (g) | — | — | 70 | 80 | — | — | — |
| E-3 (g) | — | — | — | — | 70 | — | — |
| Epikot 828 (g) | 50 | 30 | 30 | — | 30 | 70 | 80 |
| Epon1001 (g) | — | — | — | — | — | 30 | — |
| SR3542 (g) | — | — | — | 20 | — | — | — |
| Pigment green (g) | 2 | 2 | 2 | 2 | 2 | 2 | 2 |
| Aerosil-380 (g) | 5 | 5 | 5 | 5 | 5 | 5 | 5 |
| KS-66 (g) | 1 | 1 | 1 | 1 | 1 | 1 | 1 |
| 2E4MI (g) | — | 2 | — | 2 | 2 | — | — |

TABLE 1-continued

The resin material compositions and the flexibility of the Examples and the Comparative Examples

| Composition | Example 1 | Example 2 | Example 3 | Example 4 | Example 5 | Comparative Example 1 | Comparative Example 2 |
|---|---|---|---|---|---|---|---|
| 2MAZ-PW (g) | 2 | — | 2 | — | — | — | — |
| MHHPA (g) | 5 | 5 | 5 | 5 | 5 | — | — |
| DDS (g) | — | — | — | — | — | 20 | 20 |
| Curing condition | 150° C. for 60 minutes | | | | | 180° C. for 120 minutes | |
| Flexibility (time) | >20 | >20 | >20 | >20 | >20 | 1 | 4 |

The thermally curable solder resist resin materials of the Examples 1-5 were measured by various tests, such as the tests for mechanical strength, warpage, heat resistance, chemical resistance, solder resistance, water absorption, and resistance to immersion gold, and the results thereof are shown in Table 2. In the Table 2, the mechanical strength test was the measurement of tensile strength and elongation. The warpage test was performed by coating the materials of the Examples on a substrate with a two-layered copper foil and then measuring the warpage. The heat resistance test was measuring the temperature of 5% weight loss of the materials of the Examples by thermal gravimetric analysis (TGA). The chemical resistance test was testing acid and base chemical resistance, solvent resistance and resistance to immersion gold of the materials of the Examples, wherein the test solvents were isopropyl alcohol (IPA) and methyl ethyl ketone (MEK). The resistance to immersion gold test was designed for solder resist for a gild electroplating process and a nickel electroplating process, in which a thickness of the gild was 0.03-0.19 μm, and a thickness of the nickel was 3-9 μm.

TABLE 2

Characteristics of the thermally curable solder resists of the Examples

| Character | | Test standard | Example 1 | Example 2 | Example 3 | Example 4 | Example 5 |
|---|---|---|---|---|---|---|---|
| mechanical strength | tensile strength (kgf/mm2) | ASTMD882 | 1.46 | 1.21 | 0.76 | 2.2 | 1.3 |
| | elongation (%) | | 22.09 | 21.83 | 42.53 | 59.12 | 29.1 |
| temperature of 5% weight loss (° C.) | | TGA (10° C./minute) | 339 | 331 | 311 | 310 | 320 |
| warpage (mm) | | 23 ± 5° C./50 ± 10% RH/1 hr | 1.9 | 1.4 | 1.2 | 0.9 | 1.5 |
| acid and base chemical resistance | concentration of 10 wt % HCl concentration of 10 wt % H2SO4 concentration of 5 wt % NaOH | immersing by 30 minutes (IPC-TM-650 2.3.3) | pass | pass | pass | pass | pass |
| solvent resistance | IPA MEK | immersing by 30 minutes (IPC-TM-650 2.3.3) | pass | pass | pass | pass | pass |
| solder resistance | | 288° C. x 30 seconds x 3 times (IPC-TM-650 2.4.8.1C) | pass | pass | pass | pass | pass |
| water absorption (%) | | IPC-TM-650 2.6.2.1 | 0.62 | 0.66 | 0.54 | 0.52 | 0.6 |
| resistance to immersion gold | | Au: 0.03-0.19 μm; Ni: 3-9 μm | pass | pass | pass | pass | pass |

As shown in Table 1 and Table 2, the thermally curable solder resist compositions of the invention have excellent flexibility, excellent dimensional stability, heat resistance, chemical resistance, solder resistance, and low water absorption, when compared to conventional solder resist resin materials. Therefore, the thermally curable solder resist compositions of the invention are suitable for protective films of flexible printed circuit boards.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermally curable solder resist composition, comprising:
   (a) 50-100 parts by weight of an epoxy resin, wherein the epoxy resin comprises at least an aliphatic polyester modified epoxy resin represented by Formula (I) or (II):

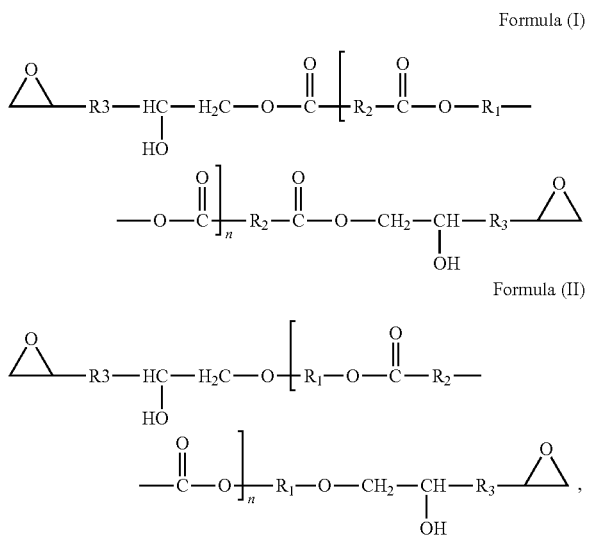

Formula (I)

Formula (II)

and wherein each of $R_1$ and $R_2$, independently, is a $C_{6-38}$ saturated or an unsaturated carbon chain, $R_3$ is ether, phenyl, a $C_{6-38}$ heterocyclic or $C_{6-38}$ saturated carbon chain, n is an integer of 1-10 and the aliphatic polyester modified epoxy resin had a molecular weight of 1000-5000, wherein the aliphatic polyester modified epoxy resin are 30-100 weight % based on the total epoxy resin;
   (b) 1-10 parts by weight of a curing agent; and
   (c) 1-10 parts by weight of a catalyst.

2. The thermally curable solder resist composition as claimed in claim 1, wherein the epoxy resin comprises cycloaliphatic epoxy resin, phenyl containing epoxy resin, carboxyl-terminated acrylonitrile-butadiene (CTBN) modified epoxy resin or combinations thereof.

3. The thermally curable solder resist composition as claimed in claim 2, wherein the phenyl containing epoxy resin comprises bisphenol-A epoxy resin.

4. The thermally curable solder resist composition as claimed in claim 2, wherein the phenyl containing epoxy resin comprises bisphenyl containing epoxy resin.

5. The thermally curable solder resist composition as claimed in claim 2, wherein the phenyl containing epoxy resin comprises phenolic epoxy resin.

6. The thermally curable solder resist composition as claimed in claim 1, wherein the aliphatic polyester modified epoxy resin is about 50-80 weight % based on the total epoxy resin.

7. The thermally curable solder resist composition as claimed in claim 1, wherein the curing agent comprises an anhydride compound, a diamine compound, or polyamine.

8. The thermally curable solder resist composition as claimed in claim 7, wherein the anhydride compound comprises methyl hexahydrophthalic anhydride (MHHPA) or methyltetrahydrophthalic anhydride.

9. The thermally curable solder resist composition as claimed in claim 7, wherein the diamine compound comprises 4,4-diaminodiphenyl sulfone.

10. The thermally curable solder resist composition as claimed in claim 7, wherein the polyamine comprises polyether diamine.

11. The thermally curable solder resist composition as claimed in claim 1, wherein the catalyst comprises an imidazole compound.

12. The thermally curable solder resist composition as claimed in claim 11, wherein the imidazole compound comprises 2-ethyl-4-methyl-imidazole, 2,4-diamino-6-[2-(2-methyl-1-imidazolyl)ethyl]1,3,5-triazine, or 2-methylimidazole.

13. The thermally curable solder resist composition as claimed in claim 1, further comprising a leveling agent, an inorganic filler, a pigment, a deformer, a flame retardant or combinations thereof.

* * * * *